（12）United States Patent
Chen et al.

(10) Patent No.: US 8,907,108 B2
(45) Date of Patent: Dec. 9, 2014

(54) P-TYPE ORGANIC SEMICONDUCTOR MATERIAL AND OPTOELECTRONIC DEVICE UTILIZING THE SAME

(71) Applicant: Industrial Technology Research Institute, Chutung, Hsinchu (TW)

(72) Inventors: Chih-Ping Chen, Alian Township (TW); Fang-Yuan Tsai, Baoshan Township (TW); Chien-Tien Chen, Taipei (TW); Gue-Wuu Hwang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/871,087

(22) Filed: Apr. 26, 2013

(65) Prior Publication Data

US 2014/0121386 A1    May 1, 2014

(30) Foreign Application Priority Data

Oct. 26, 2012 (KR) .................................. 101139632

(51) Int. Cl.
*C07D 409/14* (2006.01)
*H01L 51/00* (2006.01)
*H01J 1/62* (2006.01)
*H01L 51/42* (2006.01)

(52) U.S. Cl.
CPC ......... *H01L 51/0068* (2013.01); *H01L 51/0036* (2013.01); *H01L 51/4253* (2013.01); *H01L 51/0047* (2013.01)
USPC ................... 549/59; 549/29; 257/40; 313/506

(58) Field of Classification Search
CPC .......... C07D 409/14; H01L 51/00; H01J 1/62
USPC ........................... 549/29, 59; 257/40; 313/506
See application file for complete search history.

(56) References Cited

U.S. PATENT DOCUMENTS

| | | |
|---|---|---|
| 4,046,577 A | 9/1977 | Muzyczko et al. |
| 5,653,914 A | 8/1997 | Holmes et al. |
| 6,156,494 A | 12/2000 | Adams et al. |
| 6,706,839 B1 | 3/2004 | Wilcox et al. |
| 6,713,566 B1 | 3/2004 | Marcuccio et al. |
| 7,256,292 B2 | 8/2007 | Graham et al. |
| 7,288,617 B2 | 10/2007 | Treacher et al. |
| 7,387,980 B2 | 6/2008 | Diamond et al. |
| 7,642,216 B2 | 1/2010 | Diamond et al. |
| 7,642,324 B2 | 1/2010 | Diamond et al. |
| 7,687,635 B2 | 3/2010 | Verpoort et al. |
| 8,017,634 B2 | 9/2011 | Sinclair et al. |
| 8,048,982 B2 | 11/2011 | Higashimura et al. |
| 2004/0009368 A1 | 1/2004 | Otani et al. |
| 2005/0069792 A1 | 3/2005 | Ichiguchi et al. |
| 2005/0171027 A1 | 8/2005 | Sinclair et al. |
| 2006/0030718 A1 | 2/2006 | Zhang et al. |
| 2006/0084085 A1 | 4/2006 | Sinclair et al. |
| 2006/0084135 A1 | 4/2006 | Howitz et al. |
| 2006/0276393 A1 | 12/2006 | Milburn et al. |
| 2006/0276416 A1 | 12/2006 | Sinclair et al. |
| 2007/0149466 A1 | 6/2007 | Milburn et al. |
| 2007/0185343 A1 | 8/2007 | Verpoort et al. |
| 2008/0008682 A1 | 1/2008 | Chong et al. |
| 2008/0214509 A1 | 9/2008 | Kerbel et al. |
| 2010/0021416 A1 | 1/2010 | Lichter et al. |
| 2010/0316679 A1 | 12/2010 | Sinclair et al. |
| 2011/0110940 A1 | 5/2011 | Kerbel et al. |
| 2011/0178198 A1 | 7/2011 | Backer et al. |
| 2011/0190411 A1 | 8/2011 | Backer et al. |
| 2011/0275643 A1 | 11/2011 | Liou et al. |
| 2012/0016147 A1 | 1/2012 | Higashimura et al. |
| 2012/0029065 A1 | 2/2012 | Sinclair et al. |

FOREIGN PATENT DOCUMENTS

| | | |
|---|---|---|
| TW | 503255 B | 9/2002 |
| TW | 200813057 A1 | 3/2008 |
| TW | 201004633 A1 | 2/2010 |
| TW | 201008963 A1 | 3/2010 |
| TW | 201011049 A1 | 3/2010 |
| TW | 201138772 A1 | 11/2011 |

OTHER PUBLICATIONS

Hayakawa et al (2010): STN International HCAPLUS database, (Columbus, Ohio), Accession No. 2010:143426.*
Chao et al., "Sprially configured cis-stilbene / fluorene hybrids as bipolar, organic sensitizers for solar cell applications", Chemical Communications, Mar. 21, 2012, vol. 48, pp. 4884-4886.
Wei et al., "Doubly Ortho-Linked cis-4,4'-Bis(diarylamino)stilbene/ Fluorene Hybrids as Efficient Nondoped, Sky-Blue Fluorescent Materials for Optoelectronic Applications", J. Am. Chen. Soc, 2007, vol. 129, No. 24, pp. 7478-7479.

* cited by examiner

*Primary Examiner* — Golam M M Shameem
(74) *Attorney, Agent, or Firm* — Birch, Stewart, Kolasch & Birch, LLP

(57) ABSTRACT

Disclosed is a p-type organic semiconductor material having the formula:

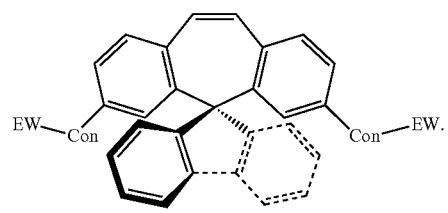

Each Con is the same and consists of a conjugated oligomer. Each EW is the same and consists of an electron withdrawing group. The p-type organic semiconductor material can be applied in an active layer of an optoelectronic device, such as an organic solar cell, an organic light-emitting diode, or an organic thin-film transistor.

7 Claims, 1 Drawing Sheet

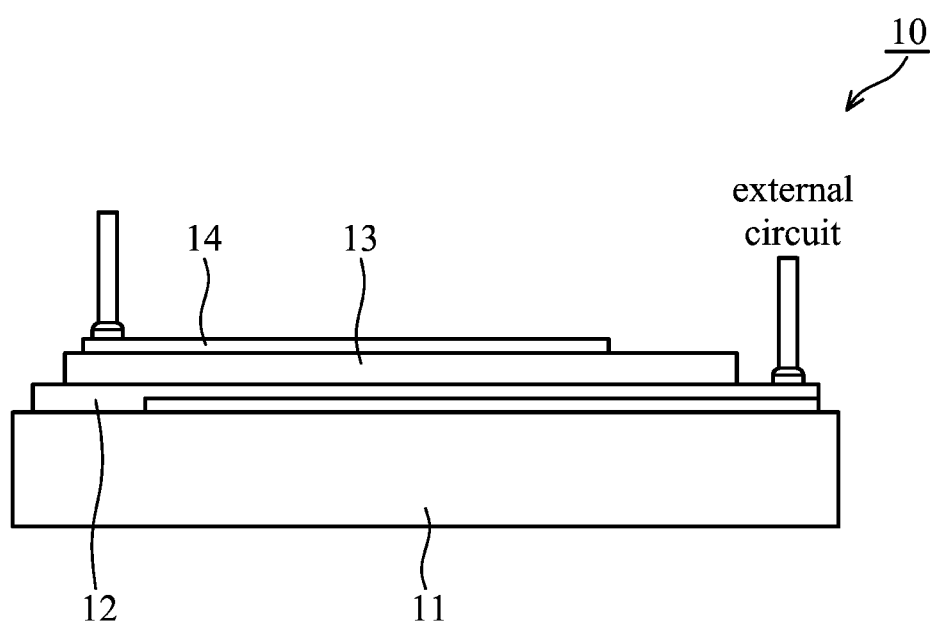

P-TYPE ORGANIC SEMICONDUCTOR MATERIAL AND OPTOELECTRONIC DEVICE UTILIZING THE SAME

CROSS REFERENCE TO RELATED APPLICATIONS

The present application is based on, and claims priority from, Taiwan Application Serial Number 101139632, filed on Oct. 26, 2012, the disclosure of which is hereby incorporated by reference herein in its entirety.

TECHNICAL FIELD

The technical field relates to a p-type organic semiconductor material, and in particular to an optoelectronic device utilizing the same.

BACKGROUND

Because organic semiconductor materials have semiconducting and optoelectronic properties, they can be applied in many optoelectronic devices such as organic thin-film transistors (OTFT), organic solar cells, organic light-emitting diodes (OLED), and photo sensors. The organic semiconductor materials are utilized to form an active film on optoelectronic devices by solution coating. Optoelectronic devices utilizing organic semiconductor materials have advantages such as being lightweight, inexpensive, easy to fabricate, and flexible, in addition to their suitability for large-area fabrication. Conjugated polymers with a conjugated backbone are among the most popular organic semiconductor materials for use in optoelectronic devices. However, the conjugated polymer has disadvantages, such as low carrier mobility and a narrow absorption band of about 400 nm to 650 nm. As such, the application of conjugated polymers in optoelectronic devices is limited. Therefore, many conjugated polymers are synthesized to enhance carrier mobility and the absorption band thereof, to further improve photoelectric efficiency.

In solar cell applications, characteristics such as high electron/hole mobility and a wide absorption band are desirable for improving power-conversion efficiency. Photo-induced or electro-induced charges are easily recombined to dissipate in an improper active layer, thereby lowering the power-conversion efficiency of an organic solar cell, including the improper active layer. If the solar light absorption is increased and the carrier mobility is enhanced, the power-conversion efficiency of the organic solar cell can be greatly increased. Thus, an electron donor material such as polymer is often combined with an electron acceptor material such as C60 by heterojunction technology. For example, the electron donor material poly(3-hexylthiophene) (P3HT) blended with [6,6]-phenyl-C61-butyric acid methyl ester (PCBM) has a power-conversion efficiency of 3.5%.

Therefore, a novel p-type organic semiconductor material for replacing the P3HT to improve the organic solar cell performance (e.g. power-conversion efficiency) is still called-for.

SUMMARY

One embodiment of the disclosure provides a p-type organic semiconductor material, having the chemical formula:

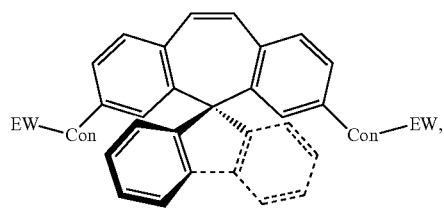

wherein each Con is the same and consists of a conjugated oligomer; and each EW is the same and consists of an electron withdrawing group.

One embodiment of the disclosure provides an optoelectronic device, having an active layer, wherein the active layer includes the described p-type organic semiconductor material.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein:

FIG. 1 shows an organic solar-cell device in one embodiment of the disclosure.

DETAILED DESCRIPTION

For the purposes of explanation, numerous specific details are set forth in the following detailed description to provide a thorough understanding of the disclosed embodiments. It will be apparent, however, that one or more embodiments may be practiced without these specific details. In other instances, well-known structures and devices are schematically shown in order to simplify the drawing.

One embodiment of the disclosure provides a p-type organic semiconductor material as shown in Formula 1.

(Formula 1)

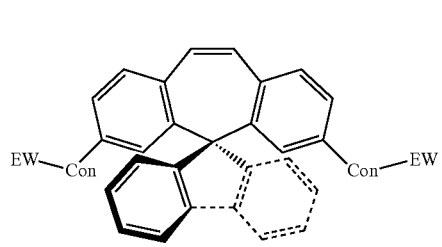

In Formula 1, each Con is the same and consists of a conjugated oligomer, and each EW is the same and consists of an electron withdrawing group. In one embodiment of the disclosure, the conjugated oligomer Con can be composed of a repeating unit such as thiophene, benzene, pyrene, pyrroline, furan, benzofuran, Benzothiophene, benzothiodiazole, pyridine, quinoline, iso-quinoline, pyrazine, pyrimidine, pyrrole, pyrazole, imidazole, indole, thiazole, isothiazole, oxazole, isoxazole, benzothiazole, benzoxazole, 1,2,4-triazole, 1,2,3-triazole, phenanthroline, oxadiazolopyridine, pyridopyrazine, benzooxadiazole, thiadiazolopyridine, selenophene, thiadiazoloquinoxaline, thienopyrazine, quinoxaline, or diketopyrrolopyrrole. For example, the conjugated thiophene oligomer has a chemical structure as shown in Formula 2.

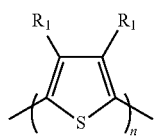

(Formula 2)

In Formula 2, each $R^1$ is independently selected from hydrogen or a $C_{3-10}$ alkyl group, and n is an integer of 2 to 20.

In one embodiment of the disclosure, the electron withdrawing group can be alkyl α-cyanoacrylate, 1,1-dicyanoethylene, halogen, nitro group (—$NO_2$), or another suitable electron withdrawing group. For example, the alkyl α-cyanoacrylate has a chemical structure as shown in Formula 3, and the 1,1-dicyanoethylene has a chemical structure as shown in formula 4.

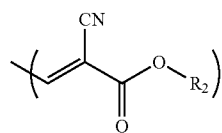

(Formula 3)

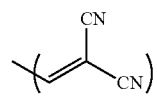

(Formula 4)

In Formula 3, $R^2$ is a $C_{3-10}$ alkyl group. In one embodiment, the p-type organic semiconductor material is synthesized as below. Note that the p-type organic semiconductor material of the disclosure can be synthesized by other steps and is not limited by the following steps. Those skilled in the art may change the synthesis steps according to their equipment and starting materials.

First, a cis-stilbene boride is reacted with a conjugated oligomer (e.g. a conjugated thiophene oligomer), as shown in Formula 5. Note that the conjugated thiophene oligomer in Formula 5 is merely illustrative rather than limiting the scope of the disclosure. In other words, the conjugated oligomer can be other suitable conjugated oligomers.

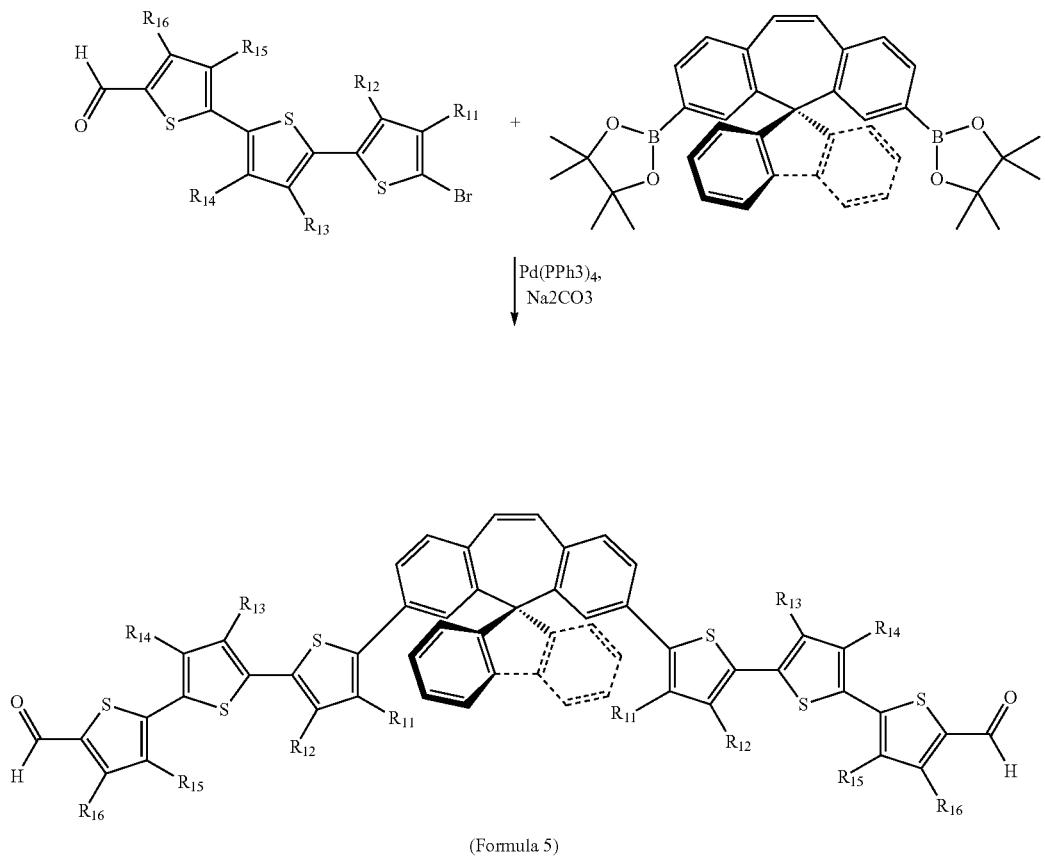

(Formula 5)

In Formula 5, each $R^{11}$ is the same, each $R^{12}$ is the same, each $R^{13}$ is the same, each $R^{14}$ is the same, each $R^{15}$ is the same, and each $R^{16}$ is the same. $R^{11}$, $R^{12}$, $R^{13}$, $R^{14}$, $R^{15}$, and $R^{16}$ are independently selected from hydrogen or a $C_{3-10}$ alkyl group.

As shown in Formula 6, the product in Formula 5 is then reacted with an electron withdrawing group (e.g. alkyl α-cyanoacrylate). Note that the alkyl α-cyanoacrylate in Formula 6 is merely illustrative rather than limiting the scope of the disclosure. In other words, the electron withdrawing group can be another suitable electron withdrawing group.

the electron acceptor material have a weight ratio of 1:0.5 to 1:2, such that the organic solar-cell device has high power-conversion efficiency.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

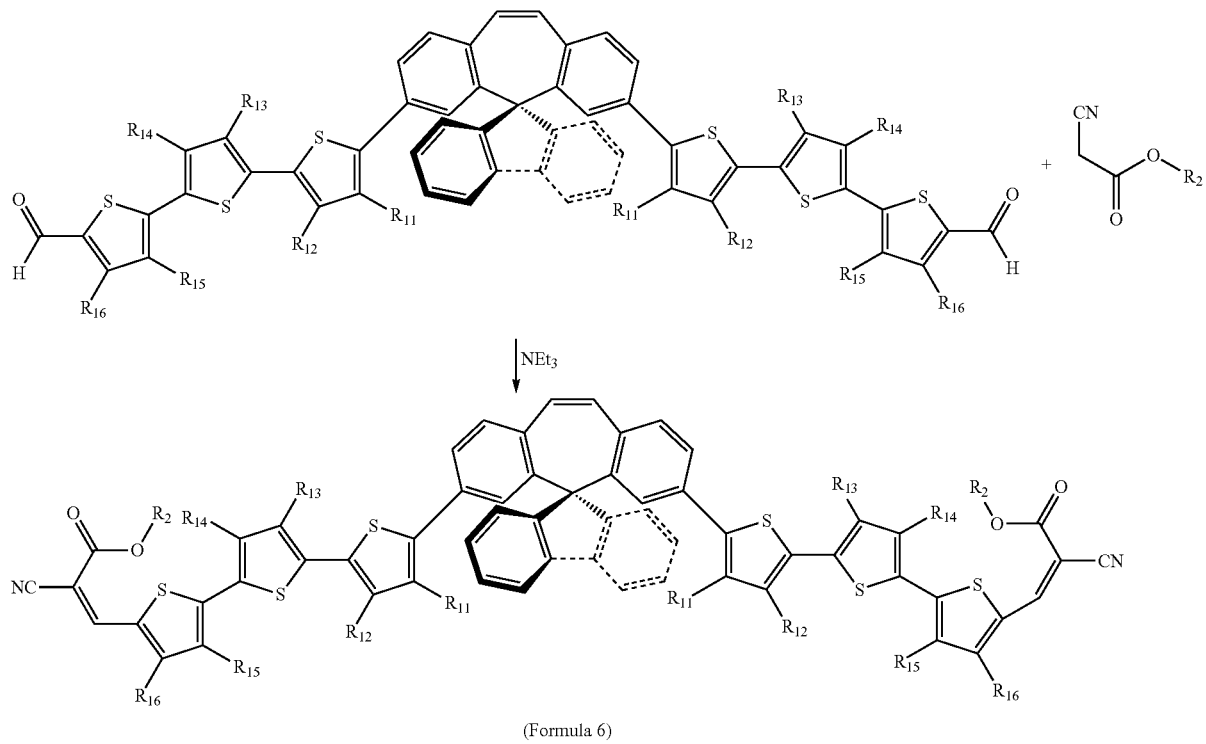

(Formula 6)

In Formula 6, each $R^2$ is the same and consists of a $C_{3-10}$ alkyl group. As described above, the p-type organic semiconductor material is a symmetric structure with an intramolecular mirror plane. Therefore, the p-type organic semiconductor material is easily regularly stacked to form a film. If different conjugated oligomers and/or electron withdrawing groups are substituted on two sides of the cis-stilbene, the asymmetric p-type organic semiconductor material will not be regularly stacked as the symmetric p-type organic semiconductor material of the disclosure. As such, the asymmetric p-type organic semiconductor material is limited in the application of the optoelectronic devices due to worse optoelectronic properties.

The p-type organic semiconductor material may serve as an active layer material of an OTFT device, an OLED device, or an organic solar-cell device. For example, the active layer of the organic solar cell includes the p-type organic semiconductor material of the disclosure and an electron acceptor material such as [6,6]-phenyl-C61-butyric acid methyl ester (abbreviated $PC_{61}BM$) or [6,6]-phenyl-C71-butyric acid methyl ester (abbreviated $PC_{71}BM$). In one embodiment, the p-type organic semiconductor material of the disclosure and

EXAMPLES

Example 1

Synthesis of p-Type Organic Semiconductor Material

A reflux condenser was connected to a 50 mL two-necked round bottom bottle, and a stirrer bar was put into the bottle. The bottle was vacuum dried and then filled with nitrogen. 2501 mg of 3,7-dibromo-5,5-spirofluorenyl[a,d]cycloheptene (Stif, 5 mmole, prepared as *J. Am. Chem. Soc.* 2007, 129, 7478), 2666 mg of bis(pinacolato)diboron (10.5 mmole), 2356 mg of pottasium acetate (24 mmole), and 163 mg of catlyst $Pd(dppf)Cl_2$ (0.2 mmole) were sequentially added into the bottle. 100 mL of dexoygenated 1,4-dioxane was injected into the bottle. The mixture in the bottle was heated to reflux for 18 hours, and then cooled to room temperature. The cooled reaction was bubbled by oxygen to be quenched. The quenched reaction was extracted by 20 mL of dichloromethane 3 times. The extraction was dried by anhydrous magnesium sulfate, filtered by celite, and then condensed by a rotatory condenser to obtain a crude. The crude was washed by 20 mL of methanol 3 times to obtain 2427 mg of the white solid compound 1 (4.08 mmole, yield=82%), as shown in Formula 7. The white solid compound 1 had a $^1$H NMR (CDCl$_3$, 400 MHz, ppm) spectrum as: δ 7.97 (d, J=7.8 Hz, 2H), δ 7.73 (d, J=7.6 Hz, 2H), δ 7.70 (dd, J=7.5, 1.0 Hz, 2H), δ 7.38 (d, J=7.3, 2H), δ 7.35 (t, J=7.6 Hz, 2H), δ 7.23 (td, J=7.7, 1.1 Hz, 2H), δ 7.01 (s, 2H), δ 1.19 (s, 24H); and a $^{13}$C NMR (100 MHz, CDCl$_3$) spectrum as: δ 152.4, 141.2, 139.0, 138.8, 135.3, 134.3, 133.3, 131.4, 127.7, 127.1, 127.0, 120.2, 83.4, 66.0, 24.7.

A reflux condenser was connected to a 25 mL two-necked round bottom bottle, and a stirrer bar was put into the bottle. 406 mg of the white solid compound 1 (0.35 mole), 223 mg of sodium carbonate (2.1 mmole), 209 mg of 5''-(4-bromo)-3,3''-di-n-hexyl-2,2':5',2''-terthiophene-5-carbaldehyde (0.77 mmole), and 35 mg of catalyst Pd(PPh$_3$)$_4$ (0.03 mmole) were sequentially added into the bottle. The bottle was degassed to remove the oxygen therein, and then filled with nitrogen. 10 mL of deoxygenated 1,2-dimethoxyethane and 1 mL were then injected into the bottle. The mixture in the bottle was then heated to reflux for 18 hours, and then cooled to room temperature. The cooled reaction was bubbled by oxygen to be quenched. The quenched reaction was extracted by 20 mL of dichloromethane 3 times. The extraction was dried by anhydrous magnesium sulfate, filtered by celite, and then condensed by a rotatory condenser to obtain a crude. The crude was purified by chromatography with an eluent (CH$_2$Cl$_2$/hexane, v/v=1/2) to obtain 384 mg of the compound 2 (0.31 mmole, yield=89%), as shown in Formula 7. The compound 2 had a $^1$H NMR (CDCl$_3$, 400 MHz, ppm) spectrum as: δ 9.82 (s, 2H), δ 8.03 (d, J=7.7 Hz, 2H), δ 7.80 (d, J=7.5 Hz, 2H), δ 7.58 (s, 2H), δ 7.44 (t, J=7.3 Hz, 2H), δ 7.41 (dd, J=8.1, 1.6 Hz, 2H), δ 7.36 (d, J=7.8 Hz, 2H), δ 7.33 (t, J=7.4 Hz, 2H), δ 7.23 (d, J=1.4 Hz, 2H), δ 7.22 (d, J=3.9 Hz, 2H), δ 7.04 (d, J=3.8 Hz, 2H), δ 6.96 (s, 2H), δ 6.79 (s, 2H), δ 2.81 (t, J=7.7 Hz, 4H), δ 2.68 (t, J=7.6 Hz, 4H), δ 1.72-1.55 (m, 8H), δ 1.43-1.31 (m, 24H), δ 0.92-0.88 (m, 12H); and a $^{13}$C NMR (CDCl$_3$, 100 MHz, ppm) spectrum as: δ182.48, 152.18, 142.16, 141.96, 141.16, 141.06, 140.25, 140.18, 139.04, 139.01, 138.32, 135.90, 134.37, 133.60, 132.92, 132.70, 129.49, 128.23, 127.75, 127.53, 126.95, 126.30, 126.05, 123.98, 120.53, 66.01, 31.66, 31.61, 30.28, 29.51, 29.46, 29.16, 29.12, 22.57, 22.57, 14.10, 14.05.

A stirrer bar was put into a 50 mL round bottom bottle. 256 mg of the compound 2 (0.20 mmole), 400 mg of octylcyanoacetate (2.2 mmole), 20 mL of anhydrous chloroform solvent were sequentially added into the round bottom bottle. 2 drops of triethyamine was then added into the round bottom bottle. The mixture was reacted at room temperature for 18 hours, and then extracted by water and dichloromethane. The dichloromethane extraction was dried by anhydrous magnesium sulfate, filtered, and then condensed by a rotatory condenser to obtain a crude. The crude was purified by chromatography with a eluent (CH$_2$Cl$_2$/hexane, v/v=1/1) to obtain 284 mg of the dark red solid compound EtStif (0.18 mmole, yield=90%), as shown in Formula 7. The compound EtStif had a $^1$H NMR (CDCl$_3$, 400 MHz, ppm) spectrum as: δ 8.20 (s, 1H), δ 8.03 (d, J=7.8 Hz, 2H, δ 7.80 (d, J=7.4 Hz, 2H), δ 7.58 (s, 2H), δ 7.45 (t, J=7.4 Hz, 2H), δ 7.41 (dd, J=7.9, 1.7 Hz, 2H), δ 7.37-7.32 (m, 4H), δ 7.27 (d, J=4.0 Hz, 2H), δ 7.23 (d, J=1.6 Hz, H), δ 7.05 (d, J=3.9 Hz, 2H), δ 6.97 (s, 2H), δ 6.79 (s, 2H), δ 4.29 (t, J=6.8 Hz, 4H), δ 2.82 (t, J=7.8 Hz, 4H), δ 2.69 (t, J=7.5 Hz, 4H), δ 1.78-1.57 (m, 12H), δ 1.41-1.25 (m, 44H), δ 0.92-0.87 (m, 18H); and a $^{13}$C NMR (CDCl$_3$, 100 MHz, ppm) spectrum: δ 63.09, 152.36, 145.85, 142.18, 141.9, 141.72, 141.2, 140.69, 140.37, 139.02, 138.77, 135.89, 133.91, 133.53, 32.92, 132.82, 132.68, 129.49, 128.23, 128.08, 127.53, 126.94, 126.22, 126.05, 123.96, 120.52, 115.98, 97.59, 77.20, 66.50, 65.99, 31.75, 31.66, 31.58, 30.19, 30.14, 29.55, 29.33, 29.17, 29.15, 29.12, 28.54, 25.78, 22.61, 22.58, 22.55, 14.09, 14.06, 14.04.

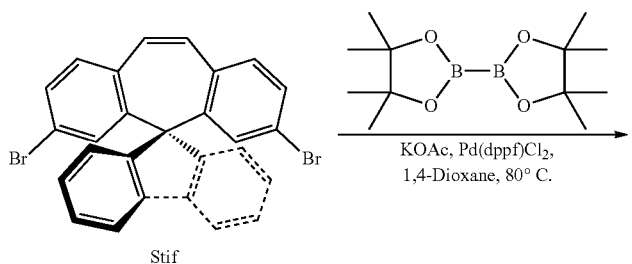

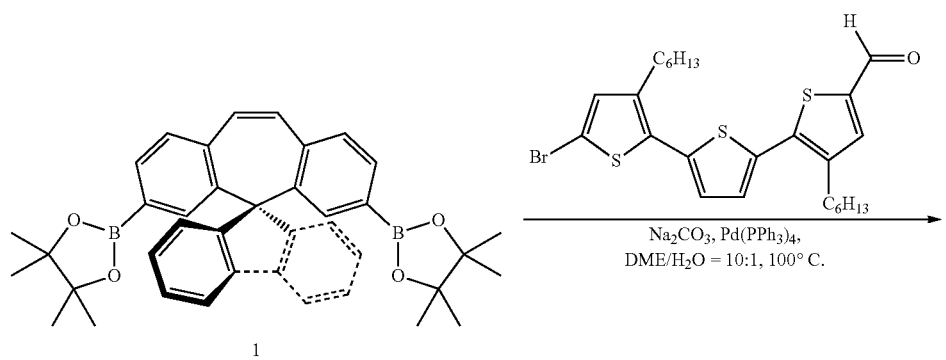

-continued

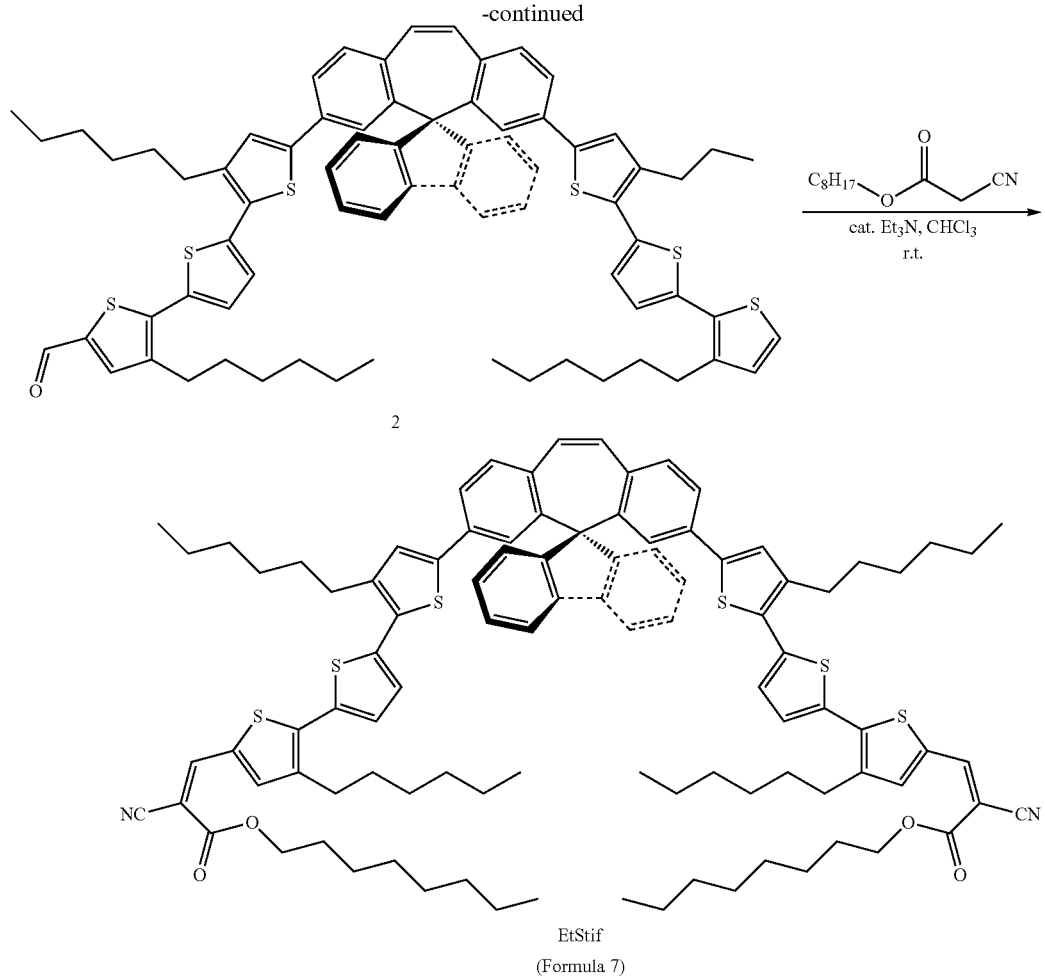

EtStif
(Formula 7)

Example 2

Organic Solar-Cell Device

An organic solar-cell device 10 was prepared as shown in FIG. 1, it included an ITO anode 11, a hole transport layer 12 composed of poly(3,4-ethylenedioxythiophene): poly(styrene-sulfonate) (PEDOT:PSS) overlying the anode 11, an active layer 13 including the p-type organic semiconductor material of the disclosure or the commercially available P3HT overlying the hole transport layer 12, and a cathode 14 composed of Ca/Al.

The active layer 13 was composed of the EtStif in Example 1 (or commercially available P3HT) and [6,6]-phenyl-C-butyric acid methyl ester (PCBM) with a blend ratio of 1:0.8, wherein the "—C—" could be C61 or C71 derivatives. The organic solar-cell device efficiency was measured under a solar luminance of AM 1.5.

The processes of manufacturing the organic solar-cell device are described below.

(1) The active layer solutions of EtStif/PCBM and P3HT/PCBM (10 mg/mL) were prepared and then stirred overnight.

(2) The ITO glass was washed by ultrasonic vibration in acetone and isopropanol for 15 minutes, respectively. The washed glass was blow-dried by nitrogen and baked on a heat plate for 5 minutes.

(3) The baked ITO glass was put under oxygen plasma for 5 minutes.

(4) The PEDOT:PSS (P-VP A14083, commercially available from Baytron) was spun (at 3000 rpm/30 sec.) on the ITO-glass to form the hole transport layer, and then baked at 150° C. in a dry box for 1 hour.

(5) The active layer solutions in step (1) were spun (for 1000 rpm/60 sec.) on the hole transport layer in the dry box, respectively.

(6) The ITO glass was charged on the 140° C. heat plate to anneal for 20 minutes, and then stood and cooled.

(7) The ITO glass was put on the photomask to evaporate a Ca/Al electrode.

(8) The device was sealed to measure its properties such as power-conversion efficiency, short-circuit current, open-circuit voltage, and filling factor as shown in Table 1.

TABLE 1

| Active layer | Short-circuit current ($J_{SC}$, mA/cm$^2$) | Open-circuit voltage ($V_{OC}$, mV) | Filling factor (FF) | Power-conversion efficiency (%) |
|---|---|---|---|---|
| P3HT/PC$_{61}$BM | 9.9 | 0.64 | 62.0 | 3.9 |
| EtStif/PC$_{61}$BM | 6.1 | 1.00 | 67.2 | 4.1 |
| EtStif/PC$_{71}$BM | 7.3 | 0.97 | 68.0 | 4.8 |

Compared to the organic solar-cell device including the conventional active layer of P3HT/PCBM, the organic solar-cell device including the active layer of the p-type organic semiconductor material of the disclosure (e.g. EtStif) has a lower short-circuit current, a higher open-circuit voltage, a higher filling factor, and a higher power-conversion efficiency.

It will be apparent to those skilled in the art that various modifications and variations can be made to the disclosed methods and materials. It is intended that the specification and examples be considered as exemplary only, with the true scope of the disclosure being indicated by the following claims and their equivalents.

What is claimed is:

1. A p-type organic semiconductor material, having the chemical formula:

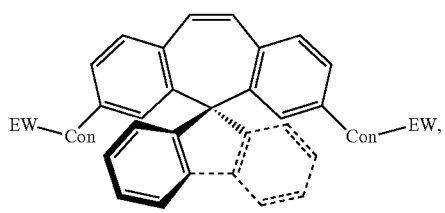

wherein each Con is the same and consists of a conjugated oligomer having the chemical formula:

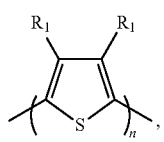

wherein each $R^1$ is independently selected from hydrogen or a $C_{3-10}$ alkyl group; and
n is an integer of 2 to 20; and
each EW is the same and consists of an electron withdrawing group.

2. The p-type organic semiconductor material as claimed in claim 1, wherein the conjugated oligomer has the chemical formula:

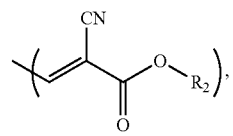

3. The p-type organic semiconductor material as claimed in claim 1, wherein the electron withdrawing group EW consists of alkyl α-cyanoacrylate, 1,1-dicyanoethylene, halogen, or nitro group ($-NO_2$).

4. The p-type organic semiconductor material as claimed in claim 3, wherein the alkyl α-cyanoacrylate has the chemical formula:

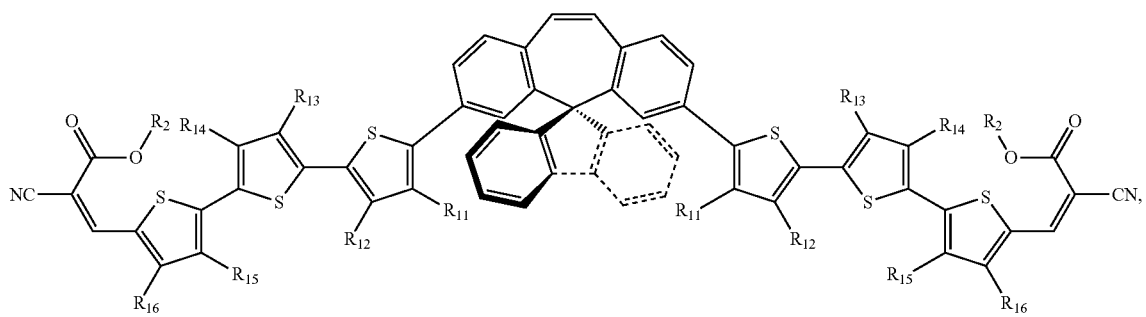

wherein $R^2$ consists of a $C_{3-10}$ alkyl group.

5. The p-type organic semiconductor material as claimed in claim 1, having the chemical formula:

wherein each $R^2$ is the same and consists of a $C_{3-10}$ alkyl group;

each $R^{11}$ is the same, each $R^{12}$ is the same, each $R^{13}$ is the same, each $R^{14}$ is the same, each $R^{15}$ is the same, and each $R^{16}$ is the same; and $R^{11}$, $R^{12}$, $R^{13}$, $R^{14}$, $R^{15}$, and $R^{16}$ are independently selected from hydrogen or a $C_{3-10}$ alkyl group.

6. An optoelectronic device, having an active layer, wherein the active layer includes the p-type organic semiconductor material as claimed in claim 1.

7. The optoelectronic device as claimed in claim 6, comprising an organic solar cell, an organic light-emitting diode, or an organic thin-film transistor.

* * * * *

UNITED STATES PATENT AND TRADEMARK OFFICE
CERTIFICATE OF CORRECTION

| | | |
|---|---|---|
| PATENT NO. | : 8,907,108 B2 | Page 1 of 1 |
| APPLICATION NO. | : 13/871087 | |
| DATED | : December 9, 2014 | |
| INVENTOR(S) | : Chih-Ping Chen et al. | |

It is certified that error appears in the above-identified patent and that said Letters Patent is hereby corrected as shown below:

ON THE TITLE PAGE:

At item (30), Foreign Application Priority Data, change:

"Oct 26, 2012 (KR) .................... 101139632"

to: --Oct. 26, 2012 (TW) .................... 101139632--.

Signed and Sealed this
Twenty-first Day of April, 2015

Michelle K. Lee
*Director of the United States Patent and Trademark Office*